United States Patent [19]

D'Souza et al.

[11] Patent Number: 5,568,429
[45] Date of Patent: Oct. 22, 1996

[54] LOW POWER DATA LATCH WITH OVERDRIVEN CLOCK SIGNALS

[75] Inventors: Godfrey P. D'Souza, San Jose; James F. Testa, Mountain View, both of Calif.

[73] Assignee: Sun Microsystems, Inc., Mountain View, Calif.

[21] Appl. No.: 498,149

[22] Filed: Jul. 5, 1995

[51] Int. Cl.⁶ .................. G11C 7/00; H03K 17/56
[52] U.S. Cl. .................. 365/189.05; 365/230.08; 365/233; 327/199; 327/208; 327/212
[58] Field of Search ................ 365/189.05, 233, 365/230.08; 327/199, 200, 201, 203, 208, 209, 210, 211, 212, 214

[56] References Cited

U.S. PATENT DOCUMENTS 5,250,852  10/1993  Ovens et al. ............... 327/208
5,260,903  11/1993  Suyama et al. .............. 365/189.05

FOREIGN PATENT DOCUMENTS 403201717  9/1991  Japan .......................... 327/199

*Primary Examiner*—Son T. Dinh
*Attorney, Agent, or Firm*—Limbach & Limbach L.L.P.

[57] ABSTRACT

A data latch with reduced data signal leakage includes a latch circuit and a clock buffer circuit which provides a differential clock signal to the input transmission gate of the latch circuit. The clock buffer circuit is biased between upper and lower supply voltage potentials which are higher and lower, respectively, than those between which the latch circuit is biased. This causes the differential clock signal to be overdriven with respect to the incoming data signal which is latched by the latch circuit. As a result, the input transmission gate of the latch circuit is reverse-biased during the inactive state of the differential clock signal, thereby isolating the storage node within the latch circuit and preventing signal leakage therefrom.

27 Claims, 12 Drawing Sheets

LOW POWER DATA LATCH WITH OVERDRIVEN CLOCK SIGNALS

BACKGROUND OF THE INVENTION

1. Filed of the Invention

The present invention relates to latch circuits, and in particular, to low power latch circuits with reduced signal leakage.

2. Description of the Related Art

With its advantage of low power consumption, logic circuitry with complementary metal oxide semiconductor field effect transistors (C-MOSFETs) has seen ever increasing use in recent years. As MOSFET technology has evolved, individual MOSFETs have become steadily smaller, e.g. with smaller feature sizes, particularly shorter channel lengths. This has allowed more and more MOSFETs to be integrated together in one integrated circuit (IC), as well as allow the requisite power supply voltage (VDD) to be lowered as well. Benefits of the former include reduced size and increased operating frequencies, while benefits of the latter include reduced power consumption. However, operating MOSFETs at today's lower power supply voltages has the undesirable effect of lowering MOSFET current which reduces the maximum operating frequency. Hence, in order to minimize reductions in circuit performance, the MOSFET threshold voltages ($V_{TH}$) are reduced so as to minimize reductions in the MOSFET current. (Further discussion of the relationship(s) between power supply voltage, threshold voltage and operating performance for MOSFETs can be found in commonly assigned, copending U.S. patent application Ser. No. 08/292,513, filed Aug. 18, 1994, and entitled "Low Power, High Performance Junction Transistor", the disclosure of which is hereby incorporated herein by reference.) However, this in turn has the undesired effect of increasing MOSFET leakage current, i.e. MOSFET current flowing when the device is turned off. This results in charge leakage to and from the signal nodes of each logic cell which prevents signal levels from achieving and maintaining full VDD and VSS values, thereby decreasing noise immunity and increasing chances of failure due to data losses caused by such leakage to or from the signal nodes. Additionally, in static logic circuits, this can result in leakage currents flowing to or from the signal nodes of each logic cell, thereby increasing the current requirements for the power supply(ies).

Accordingly, it would be desirable to have a logic circuit having transistors with reduced threshold voltages so as to take maximum advantage of the benefits available from the use of lower power supply voltages while simultaneously minimizing chances of failure due to data losses caused by signal leakage to or from data storage nodes, minimizing reductions in maximum operating frequency and providing improved output signal levels for improved noise immunity, as well as minimizing power supply current requirements.

SUMMARY OF THE INVENTION

In accordance with the present invention, signal leakage from within a data latch is prevented by using "overdriven" clock signals so as to cause the input synchronizing element of the data latch to be reverse-biased during the inactive states of the clock signals. This ensures that the storage node within the data latch is isolated and that peak signal voltage levels are maintained due to reduced signal leakage from the storage node. This advantageously allows the data latch to have transistors with reduced threshold voltages so as to take maximum advantage of the power-saving benefits available with the use of lower power supply voltages (e.g. less than 3.5 volts) while simultaneously minimizing chances of failure due to data losses caused by charge leakage from the data storage node, minimizing reductions in maximum operating frequency and providing improved output signal levels for improved noise immunity, as well as minimizing power supply current requirements.

An apparatus including a data latch with reduced data signal leakage in accordance with one embodiment of the present invention includes: first and second power supply nodes for connecting to first and second power supply voltages, respectively; a data source for providing a source data signal; a data storage circuit including a data storage node for receiving a synchronous data signal and in accordance therewith providing at the data storage node a data signal having a data signal value within a range defined by upper and lower voltage values; and a data transfer circuit, coupled to the data source and the data storage circuit, for receiving the source data signal and first and second clock signals and in accordance therewith providing the synchronous data signal, wherein the coupled data storage and transfer circuits are coupled to the first and second power supply nodes and provide first and second current paths between the data storage node and the first and second power supply nodes, respectively, and wherein each one of the first and second clock signals has first and second clock signal states and has upper and lower peak clock signal levels defined by first and second voltage values which are above and below the upper and lower voltage values, respectively, whereby the data storage node is isolated from the first and second current paths during the first clock signal states of the first and second clock signals. These and other features and advantages of the present invention will be understood upon consideration of the following detailed description of the invention and the accompanying drawings.

DETAILED DESCRIPTION OF THE INVENTION

Figure 1:
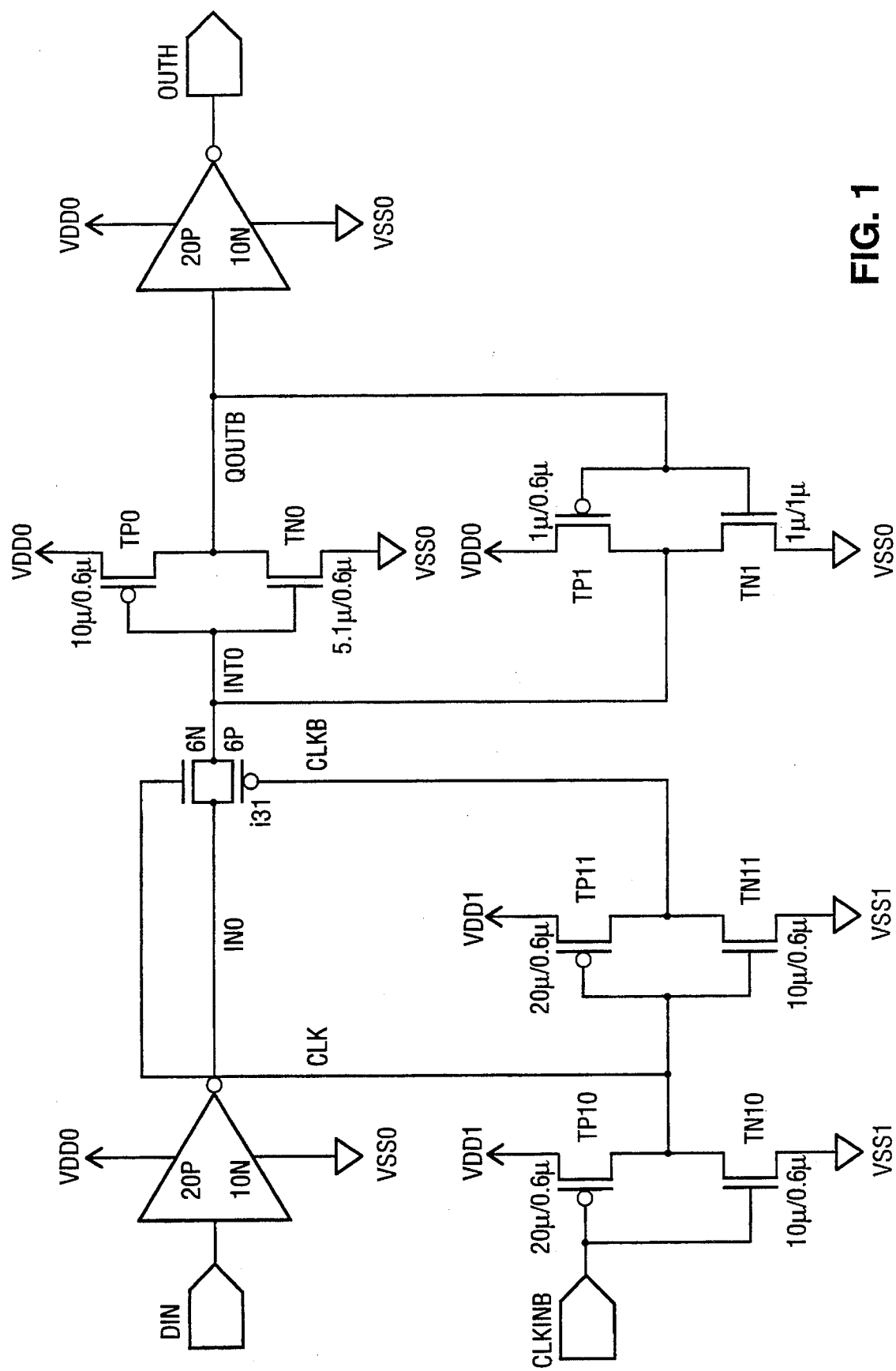
FIG. 1 is a schematic diagram of a static data latch in accordance with one embodiment of the present invention.

Throughout the following discussion, unless indicated otherwise, it is assumed that all P-MOSFET and N-MOSFET substrates, or "bulks," are connected to their respective power supply terminals (e.g. typically to power supply nodes VDD and VSS, respectively). Also, throughout the figures alphanumeric legends are used alongside various circuit elements to identify certain characteristics of such elements. For example: the widths and lengths of the drain-to-source channels of MOSFETS TP0 and TN0 in FIG. 1 are 10 microns and 0.6 microns, and 5.4 microns and 0.6 microns, respectively; the "6N" and "6P" adjacent the transmission gate i31 in FIG. 1 indicate that the widths of the drain-to-source channels of the N-MOSFETS and P-MOSFETS in the transmission gate i31 are both 6 microns (with lengths of 0.6 microns in both); and the "20P" and "10N" within the inverters in FIG. 1 indicate that the widths of the drain-to-source channels of the P-MOSFETS and N-MOSFETS in the inverters are 20 microns and 10 microns, respectively (with lengths of 0.6 microns in both). It should be understood that such dimensions, etc. are intended to be exemplary only and are not intended to require or be limited to any specific semiconductor processing technology, and as semiconductor processing technology advances further such dimensions may be altered, e.g. reduced, as desired.

Further, the following discussion is in terms of "positive" logic, i.e. where a logic 1 is a logic "high" (e.g. a positive voltage) and a logic 0 is a logic "low" (e.g. approximately equal to the circuit reference potential). However, it should be understood that logic circuits with reduced charge leakage in accordance with the present invention can be used with "negative" logic as well (i.e. where a logic 1 is a logic "low", e.g. a negative voltage, and a logic 0 is a logic "high", e.g. approximately equal to the circuit reference potential), with P-MOSFETs and N-MOSFETs interchanged appropriately in accordance with well known circuit design principles. Referring to FIG. 1, a static data latch in accordance with one embodiment of the present invention can be represented schematically as shown. A data input signal DIN is buffered and inverted by an inverter to produce an input signal IN0 which is synchronously passed by a transmission gate I31 to an interior storage node INT0. This node INT0 is the input to a latch formed by back-to-back inverters consisting of totem-pole-coupled P-MOSFET and N-MOSFET pairs TP0, TN0 and TP1, TN1 which are biased between primary power supply potentials VDD0 and VSS0. The latched output signal QOUTB is buffered and inverted by an output inverter to produce an output signal OUTH.

The transmission gate I31 is controlled by a differential clock signal consisting of clock signal phase CLK and its inverse phase CLKB. This differential clock signal CLK, CLKB is generated from an input clock signal CLKINB which is inverted twice by two MOSFET inverters consisting of totem-pole-coupled P-MOSFET and N-MOSFET pairs TP10, TN10 and TP11, TN11 which are biased between secondary o power supply potentials VDD1 and VSS1. These secondary power supply potentials VDD1 and VSS1 are "extended" in the sense that the voltages of potentials VDD1 and VSS1 are higher and lower than the voltages of primary power supply potentials VDD0 and VSS0, respectively (VDD1>VDD0 and VSS1<VSS0). For example, where the primary power supply potentials VDD0 and VSS0 are 1.0 and 0.0 volts, respectively, the secondary power supply potentials VDD1 and VSS1 are 1.3 and −0.2 volts, respectively. As result, the differential clock signal phases CLK and CLKB have similar upper and lower peak clock signal levels and are, therefore, "overdriven" with respect to the data signals which are based upon the lower, primary power supply potentials VDD0, VSS0.

Accordingly, with such extended clock signal levels, the transistors forming the transmission gate I31 (which is simply two pass gates interconnected drain-to-drain and source-to-source with their respective gates driven by clock signal phase CLK or CLKB) become reverse-biased when the clock signal phases CLK, CLKB are in their inactive, or nonasserted, states. With the transistors of the transmission gate I31 reverse-biased in such a manner, the storage node INT0 within the latch circuit is isolated from the input IN0 coming from the input inverter, thereby preventing signal leakage (either thereto or therefrom, depending upon the respective polarities of the signal at the storage node INT0 and input IN0 at any given time). It should be appreciated that the aforementioned isolation from the input IN0 includes isolation from the current paths between it and the power supply nodes within the inverter (connected to power supply potentials VDD0 and VSS0) which is driving the input IN0 node. This isolation is important since any leakage current(s) to or from the storage node INT0 which would otherwise flow through the input IN0 node is either sourced by VDD0 or sunk by VSS0, respectively, via the inverter.

Figure 2:
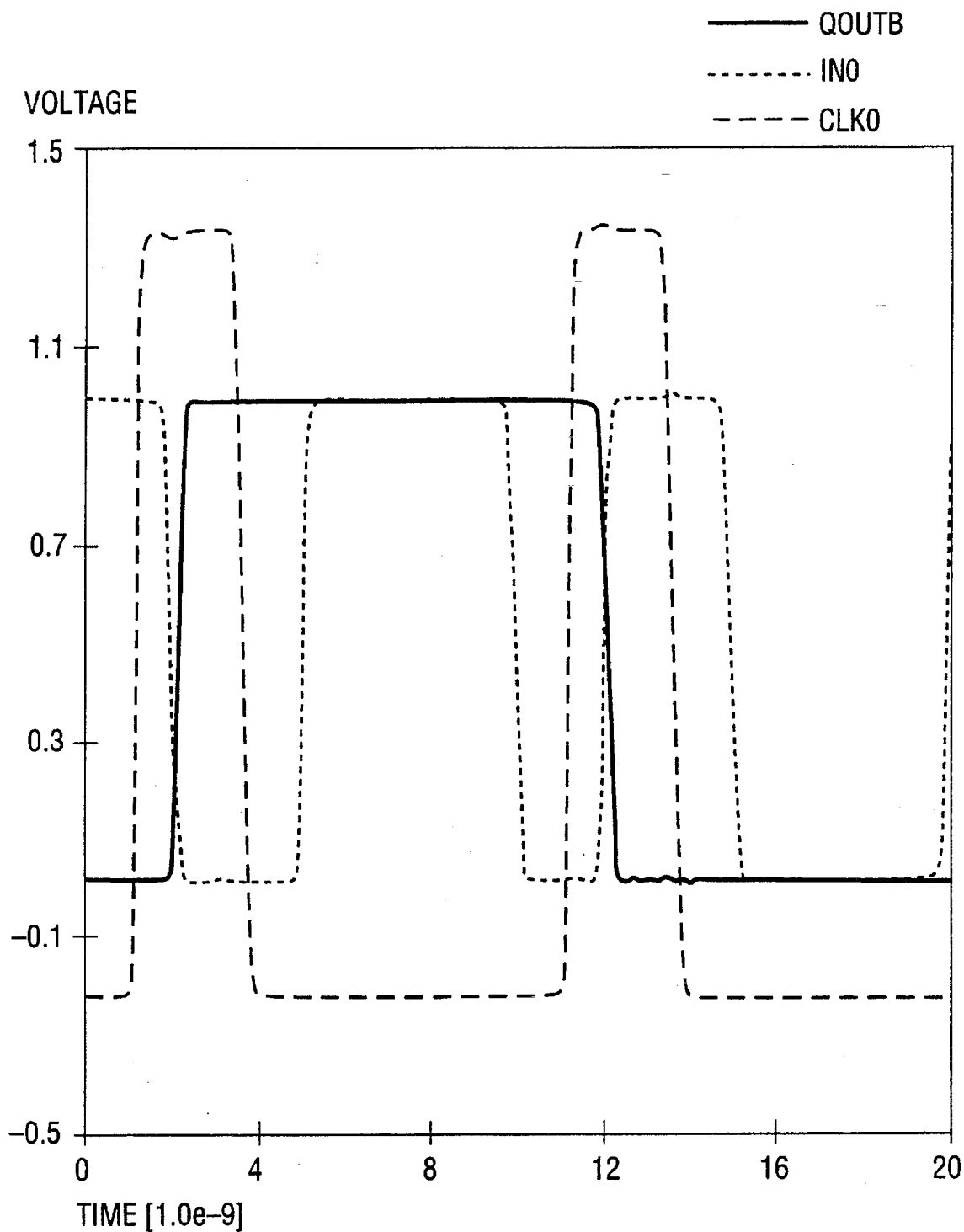
FIG. 2 is a signal timing diagram for the data latch of FIG. 1.

Referring to FIG. 2, advantages realized by the static data latch of FIG. 1 can be better understood. As shown, when the buffered input data signal IN0 is synchronously clocked into the latch circuit by the transmission gate I31 with the overdriven clock phases CLK, CLKB, the latched output QOUTB remains stable and maintains its peak signal levels.

Figure 3:
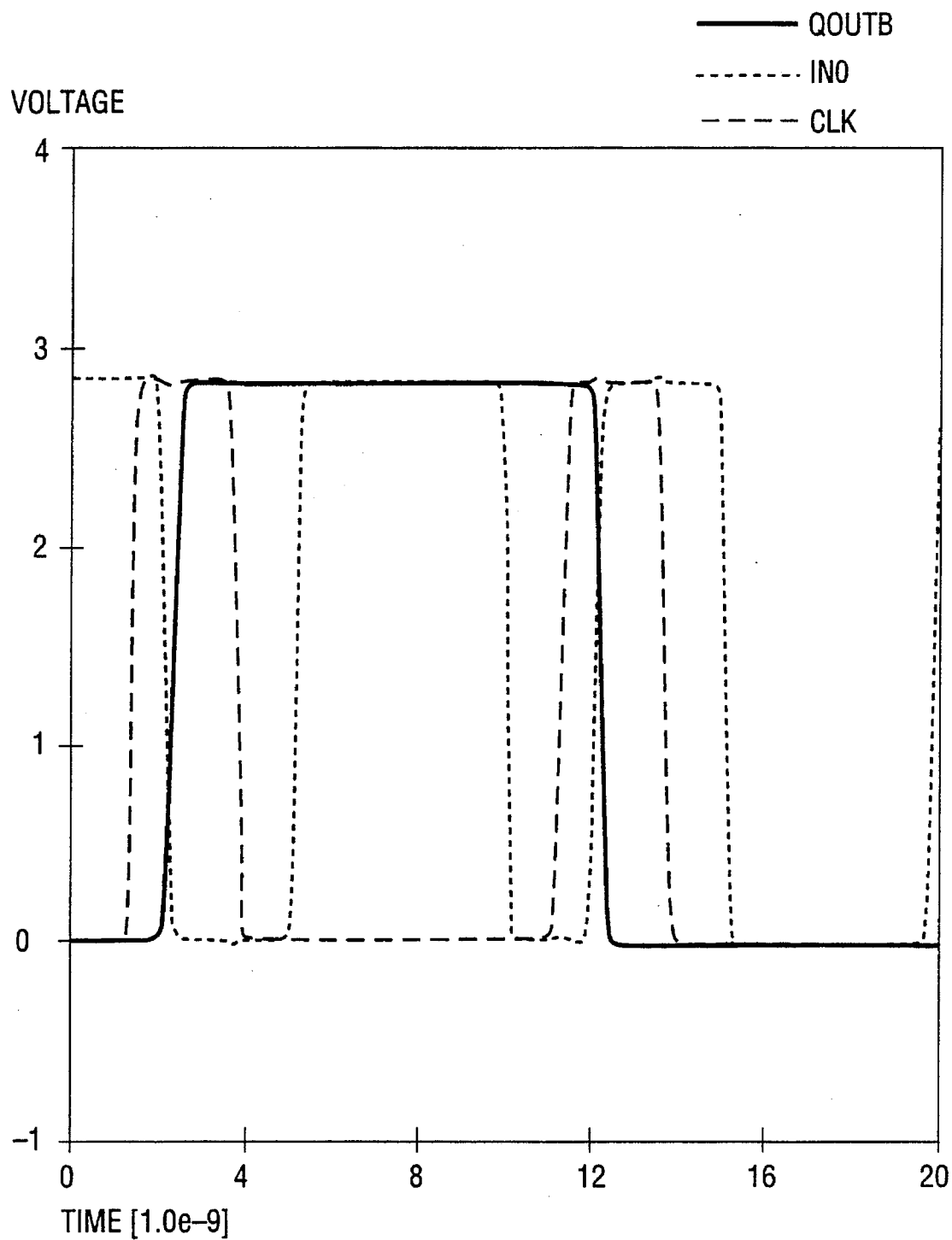
FIG. 3 is a signal timing diagram for the data latch of FIG. 1 when used with conventional clock signals, power supply voltages and MOSFET threshold voltages.
Figure 4:
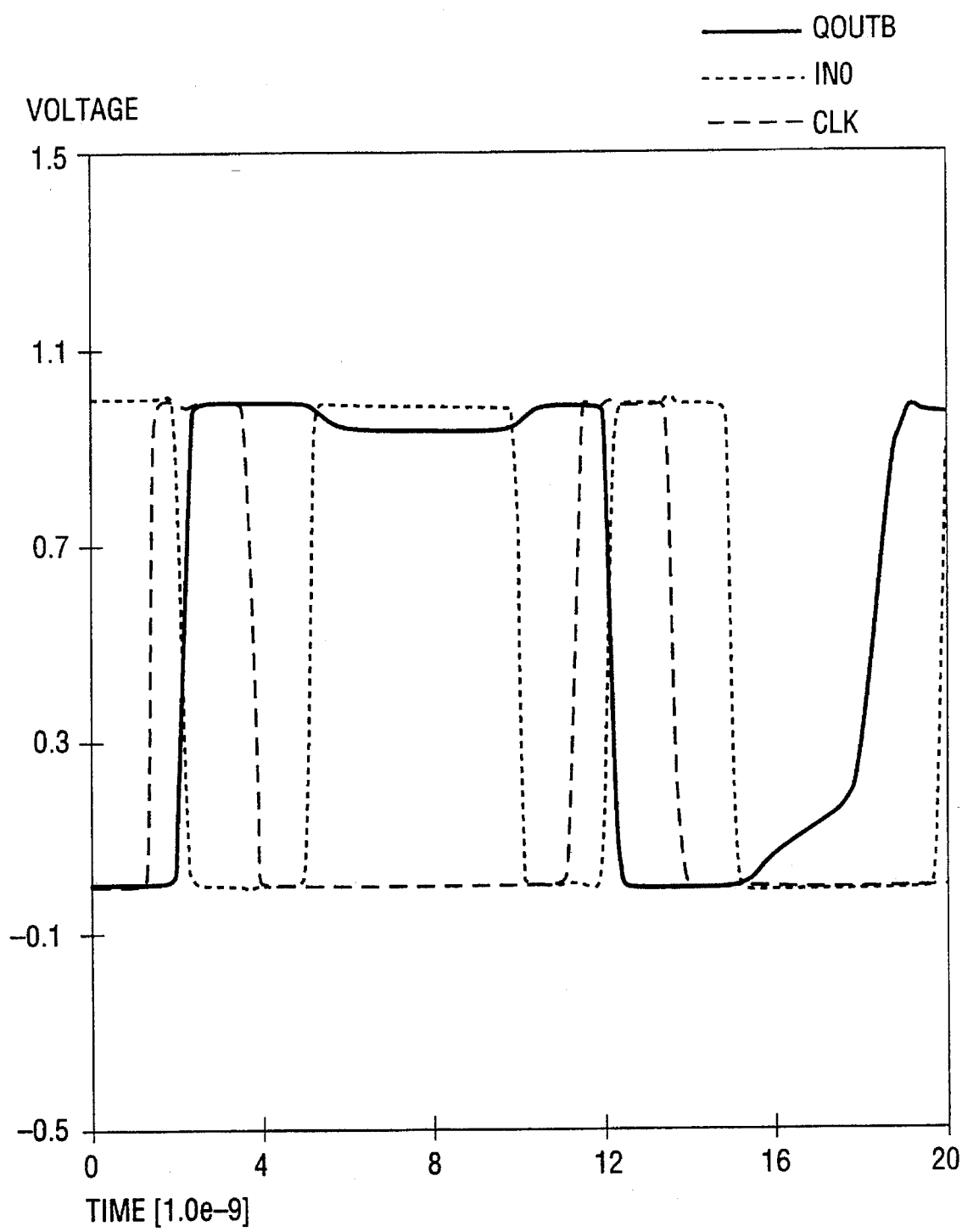
FIG. 4 is a signal timing diagram for the data latch of FIG. 1 when used with conventional clock signals, a reduced voltage power supply and reduced MOSFET threshold voltages.

Referring to FIGS. 3 and 4, the aforementioned advantages provided by the static data latch of FIG. 1 can be better appreciated. For the signal timing diagram of FIG. 3, the secondary power supply potentials VDD1 and VSS1 have been reduced and set equal to the conventional primary power supply potentials VDD0 and VSS0, which in this case are 2.8 and 0.0 volts, respectively, and the MOSFETs all have conventional threshold voltages. Under these conditions, the latched data output QOUTB remains stable. However, referring to FIG. 4, when the primary power supply potentials VDD0, VSS0 and secondary power supply potentials VDD1, VSS1 are maintained equal but reduced in magnitude to 1.0 and 0.0 volts, respectively, and the MOSFETs' threshold voltages are reduced, the latch fails. In other words, the latched output QOUTB is no longer stable and due to leakage through the inverters and transmission gate I31, the latch is unable to maintain the peak signal levels of the latched output QOUTB.

Figure 5:
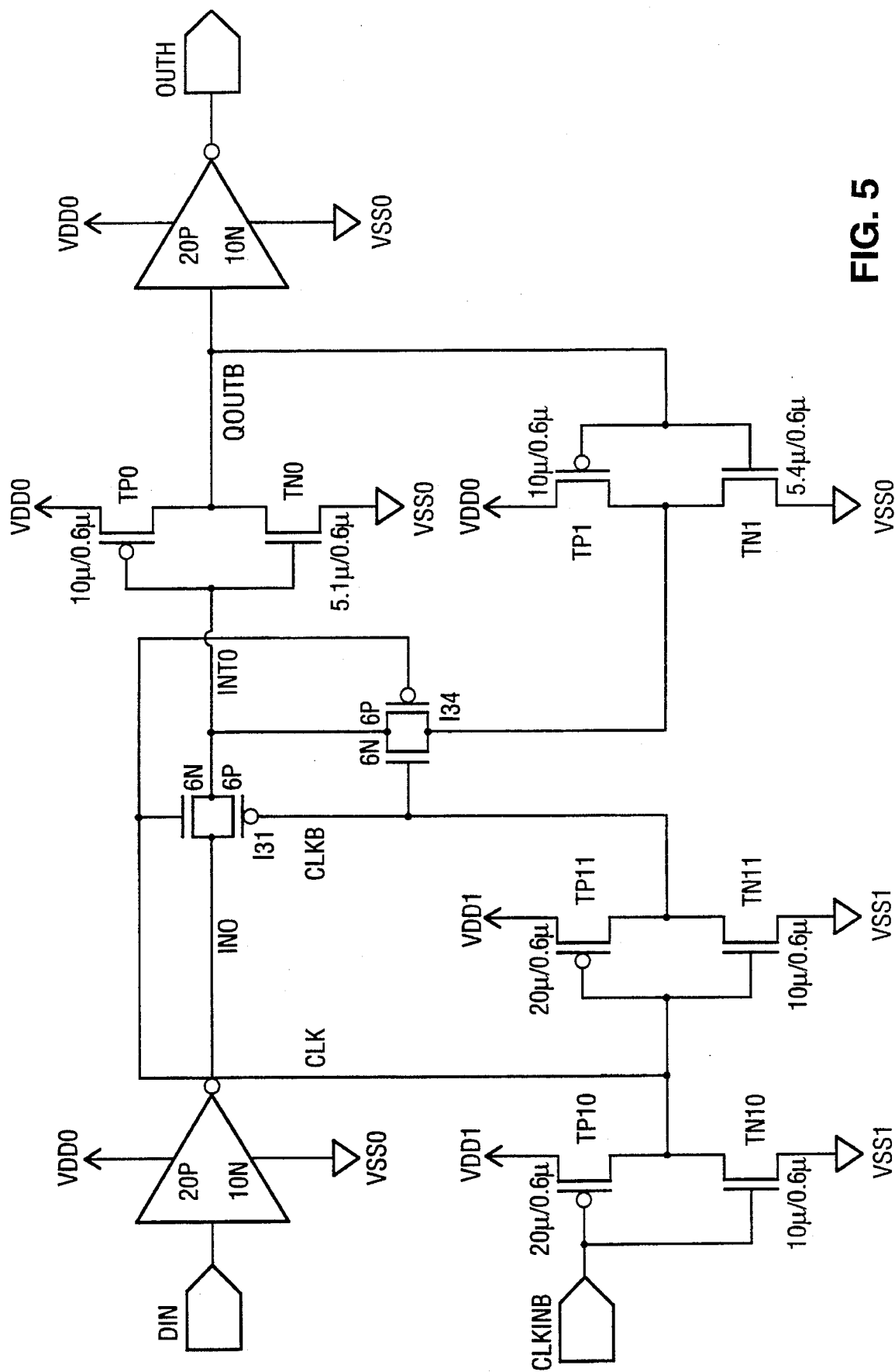
FIG. 5 is a schematic diagram of a static data latch in accordance with another embodiment of the present invention.

Referring to FIG. 5, a static data latch in accordance with another embodiment of the present invention can be represented schematically as shown. As in the static data latch of FIG. 1, a data input signal DIN is buffered and inverted by an inverter to produce an input signal IN0 which is synchronously passed to a latch formed by inverters consisting of totem-pole-coupled P-MOSFET and N-MOSFET pairs TP0, TN0 and TP1, TN1 which are biased between primary power supply potentials VDD0 and VSS0, with the latched output signal QOUTB buffered and inverted by an output inverter to produce an output signal OUTH. However, in this embodiment, two transmission gates I31, I34 are used to synchronize the data being inputted to and stored within the latch circuit. The input transmission gate I31 controlled by the "overdriven" clock signal phases CLK, CLKB provide isolation (from the input IN0) for the signals maintained at the input and output nodes INT0, QOUTB of the latch circuit.

Figure 6:
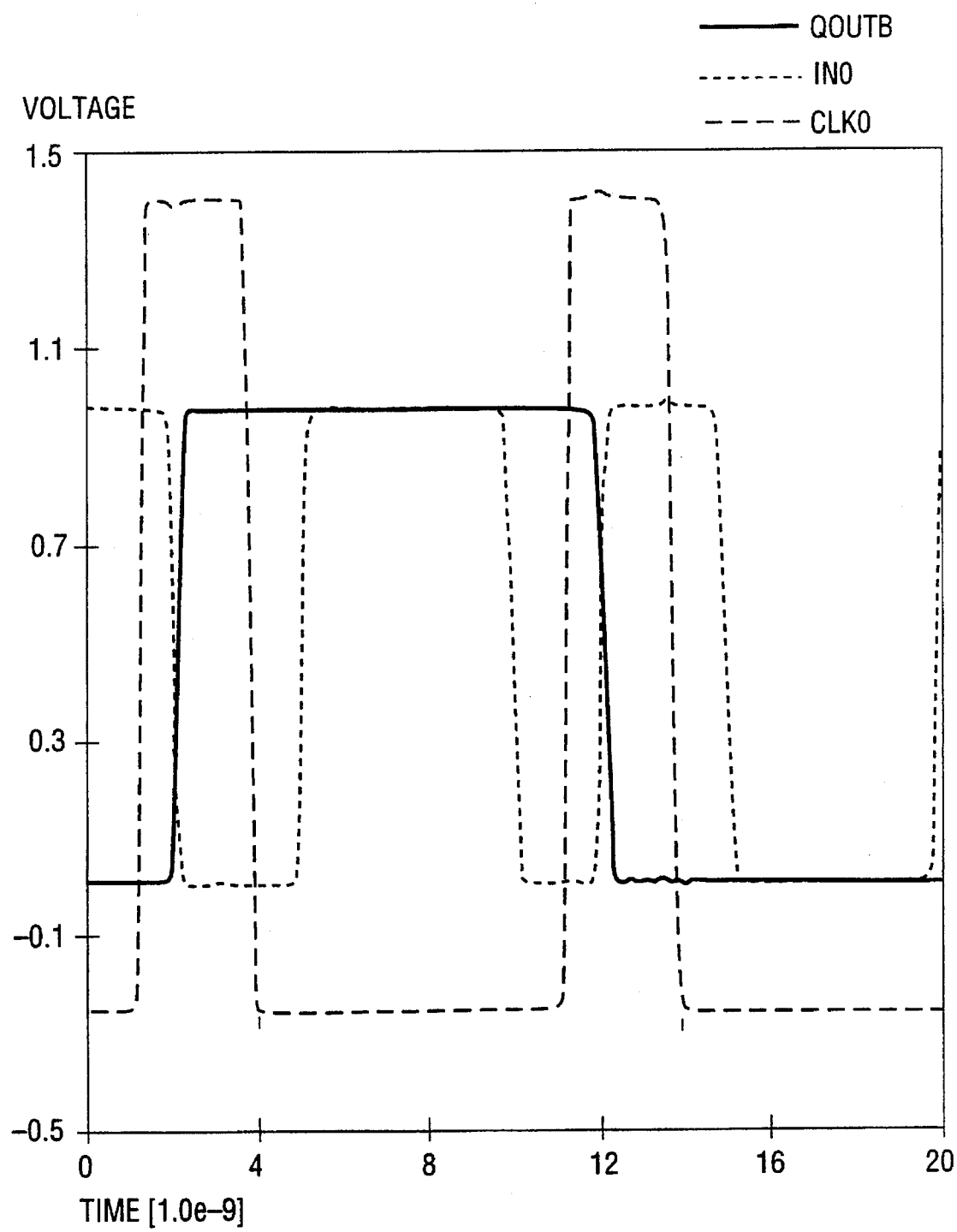
FIG. 6 is a signal timing diagram for the static data latch of FIG. 5.
Figure 7:
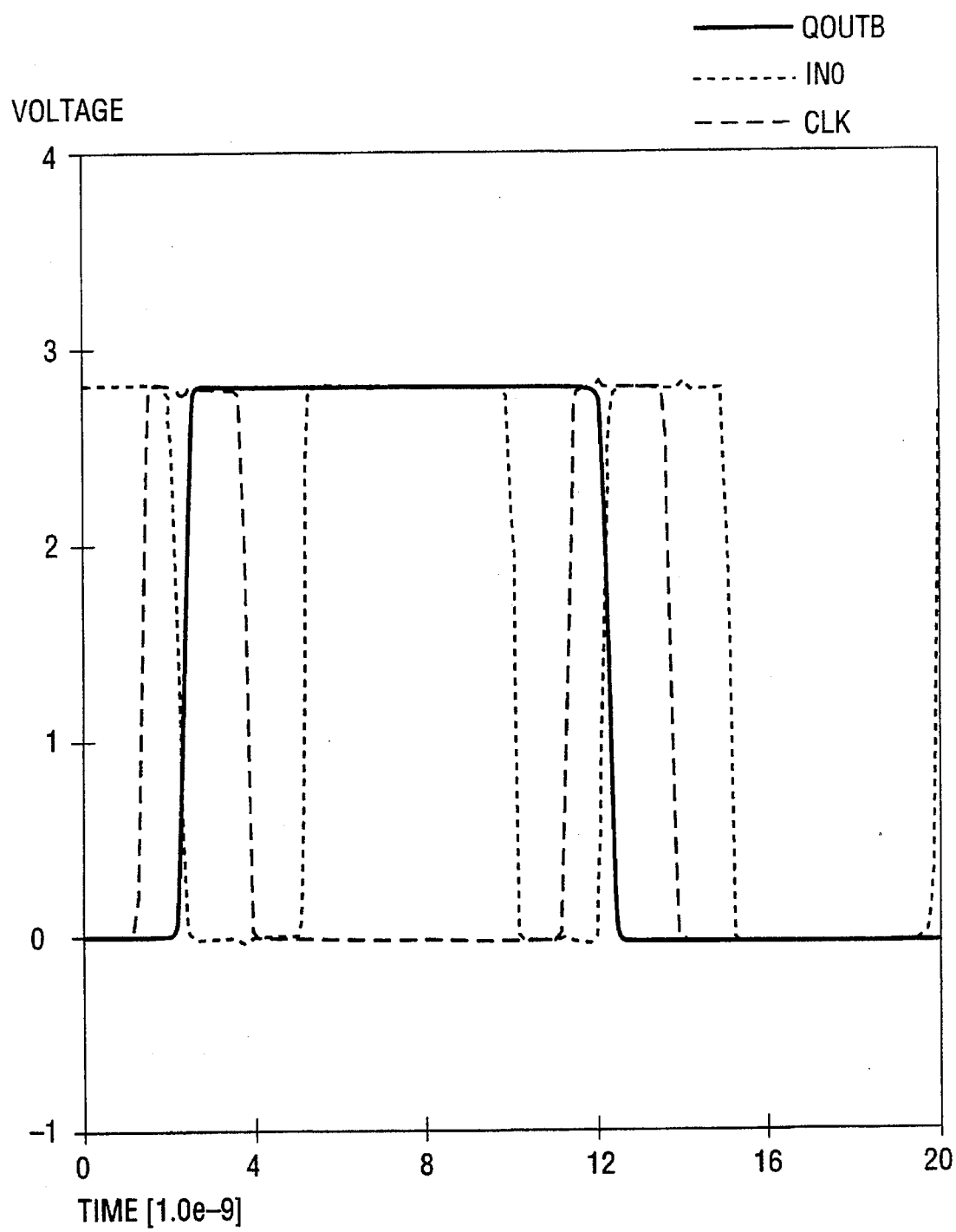
FIG. 7 is a signal timing diagram for the static data latch of FIG. 5 when used with conventional clock signals, power supply voltages and MOSFET threshold voltages.
Figure 8:
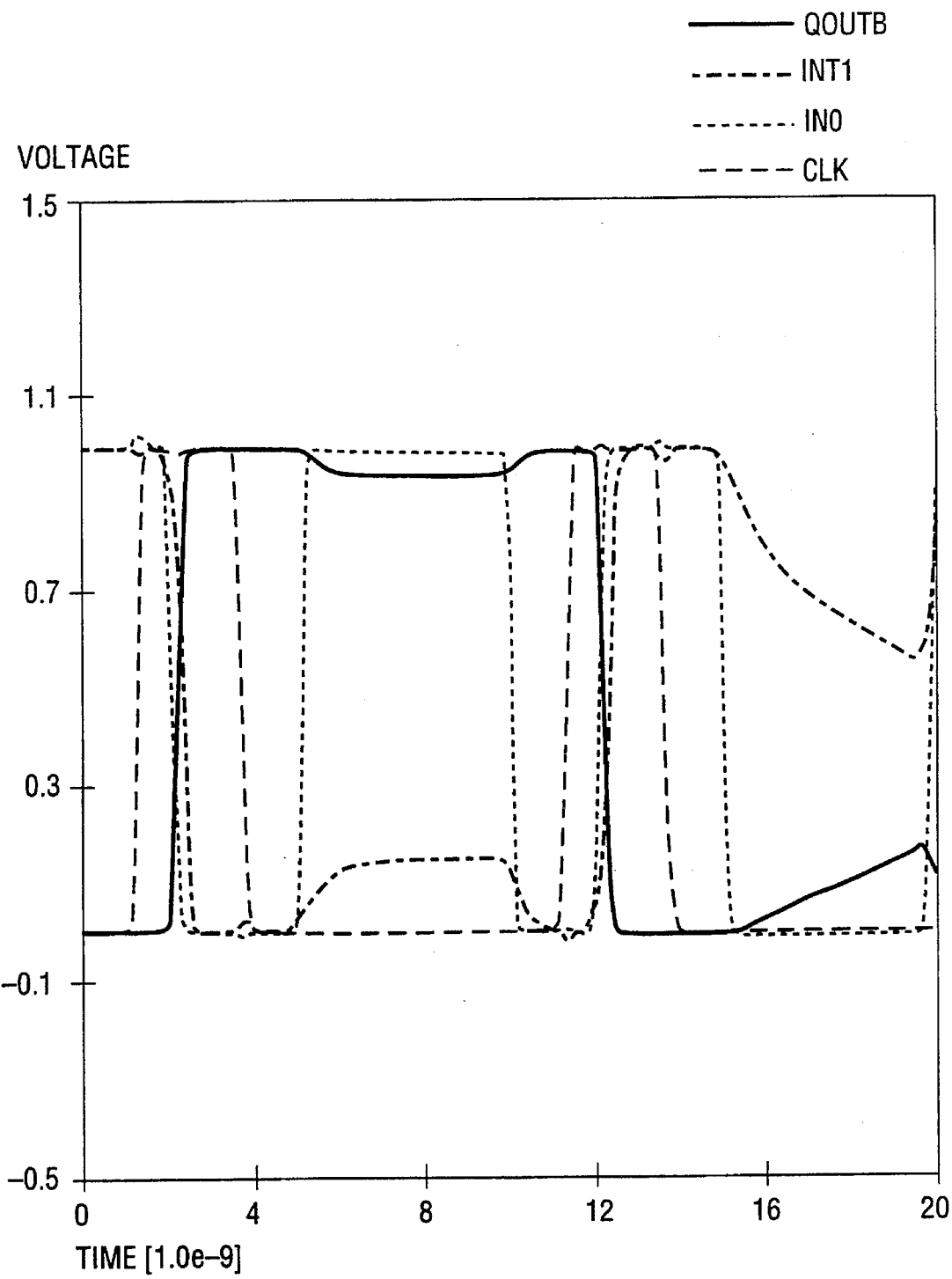
FIG. 8 is a signal timing diagram for the static data latch of FIG. 5 when used with conventional clock signals, a reduced voltage power supply and reduced MOSFET threshold voltages.

Referring to FIGS. 6, 7 and 8, advantages realized by the static data latch of FIG. 5 can be better appreciated. As shown in FIG. 6, when the buffered input data signal IN0 is synchronously clocked into and stored within the latch circuit via the transmission gates I31, I34 with the overdriven clock phases CLK, CLKB, the latched output QOUTB remains stable and maintains its peak signal levels.

Referring to FIGS. 7 and 8, however, when the secondary power supply potentials VDD1 and VSS1 are reduced and set equal to the conventional primary power supply potentials VDD0 and VSS0, things change. As shown in FIG. 7, when VDD0 and VSS0 are 2.8 and 0.0 volts respectively, and the MOSFETs have conventional threshold voltages, the latched data output QOUTB is maintained. However, as shown in FIG. 8, when the primary power supply potentials VDD0, VSS0 and secondary power supply potentials VDD1, VSS1 are maintained equal but reduced in magnitude to 1.0 and 0.0 volts, respectively, and the MOSFETs' threshold voltages are reduced, the latch fails. In other words, the latched output QOUTB is no longer maintained, i.e. due to leakage through the inverters and transmission gates I31, I34, the latch is unable to maintain the peak signal levels of the latched output QOUTB.

Figure 9:
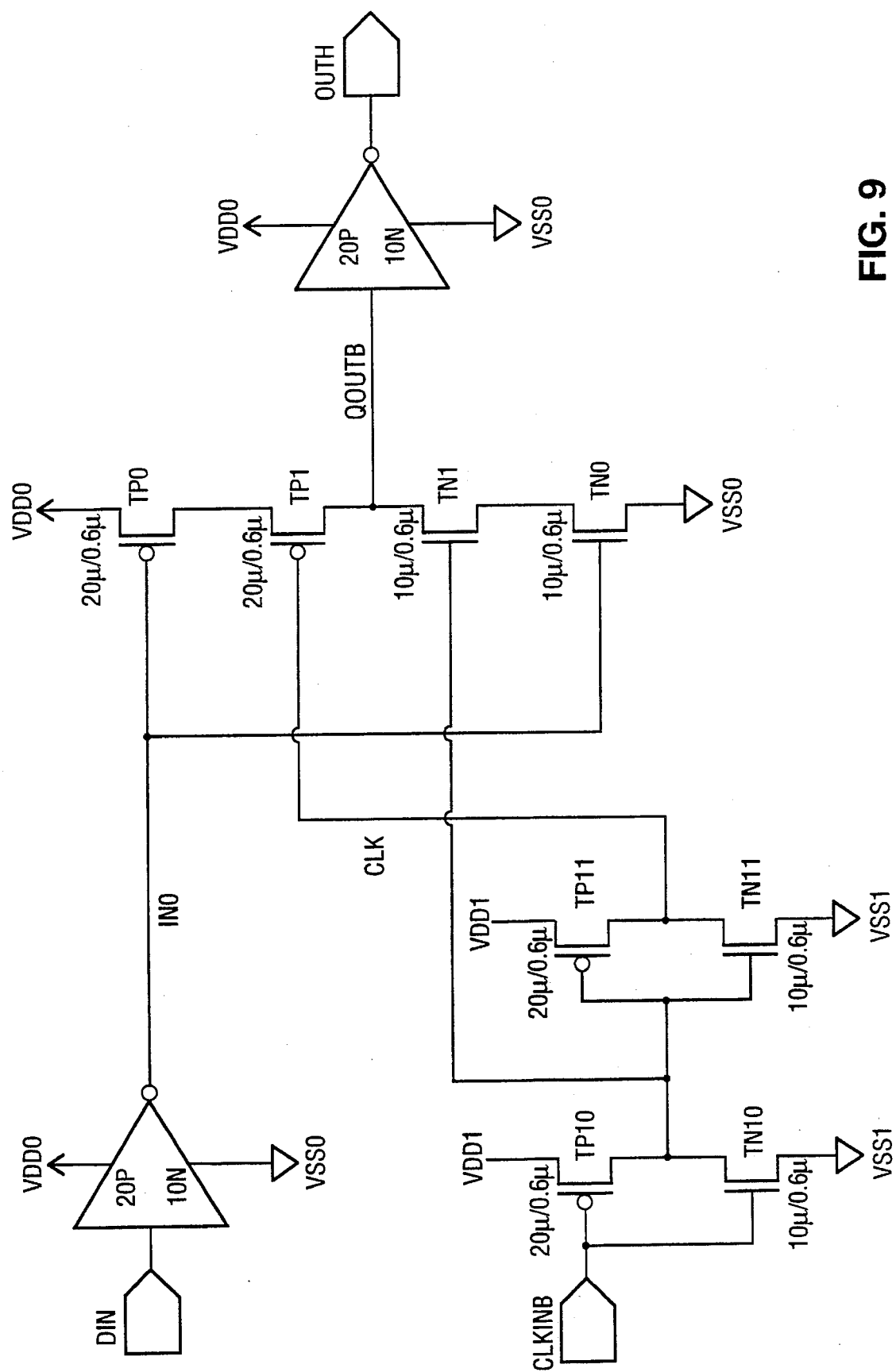
FIG. 9 is a schematic diagram of a dynamic data latch in accordance with still another embodiment of the present invention.

Referring to FIG. 9, a dynamic data latch in accordance with still another embodiment of the present invention can be represented schematically as shown. Similar to the static data latches of FIGS. 1 and 5, a data input signal DIN is buffered and inverted by an inverter to produce an input signal IN0 which is synchronously passed to a latch. This latch, dynamic here rather than static, is formed by totem-pole-coupled P-MOSFETs TP0. TP1 and N-MOSFETs TN1, TN0 which are biased between the primary power supply potentials VDD0, VSS0, with the latched output signal buffered and inverted by an output inverter to produce an output signal OUTH. In this embodiment, instead of transmission gates, P-MOSFET TP1 and N-MOSFET TN1 are used (e.g. as pass gates) to synchronize the data being inputted to and stored within the latch circuit. When controlled by the "overdriven" clock signal phases CLK, CLKB, P-MOSFET TP1 and N-MOSFET TN1 provide isolation (from the input IN0 and the power supply terminals VDD0, VSS0) for the signal QOUTB maintained at their mutually connected drain terminals. (In accordance with the foregoing discussion, P-MOSFETs TP0 and TP1 can be interchanged with one another and N-MOSFETs TN0 and TN1 can be interchanged with one another, with clock signals CLK and CLKB driving N-MOSFET TN 1 and P-MOSFET TP1, respectively, and data signal IN0 driving N-MOSFET TN0 and P-MOSFET TP0. Further discussion of this analogous circuit configuration can be found in co-pending, commonly-assigned U.S. patent application Ser. No. 08/357,607, entitled "Dynamic Clocked Inverter Latch With Reduced Charge Leakage," the disclosure of which is incorporated herein by reference.)

Figure 10:
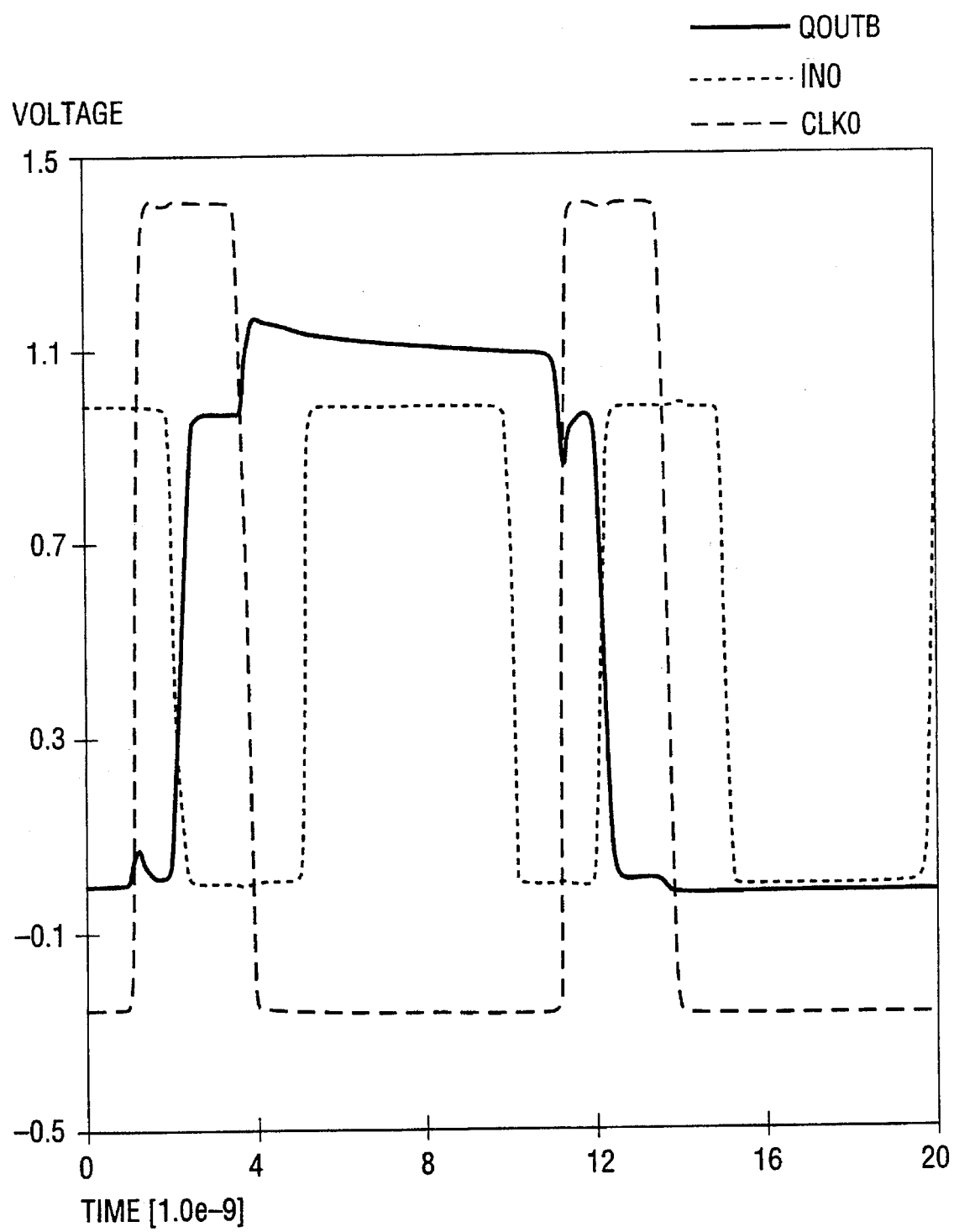
FIG. 10 is a signal timing diagram for the dynamic data latch of FIG. 9.
Figure 11:
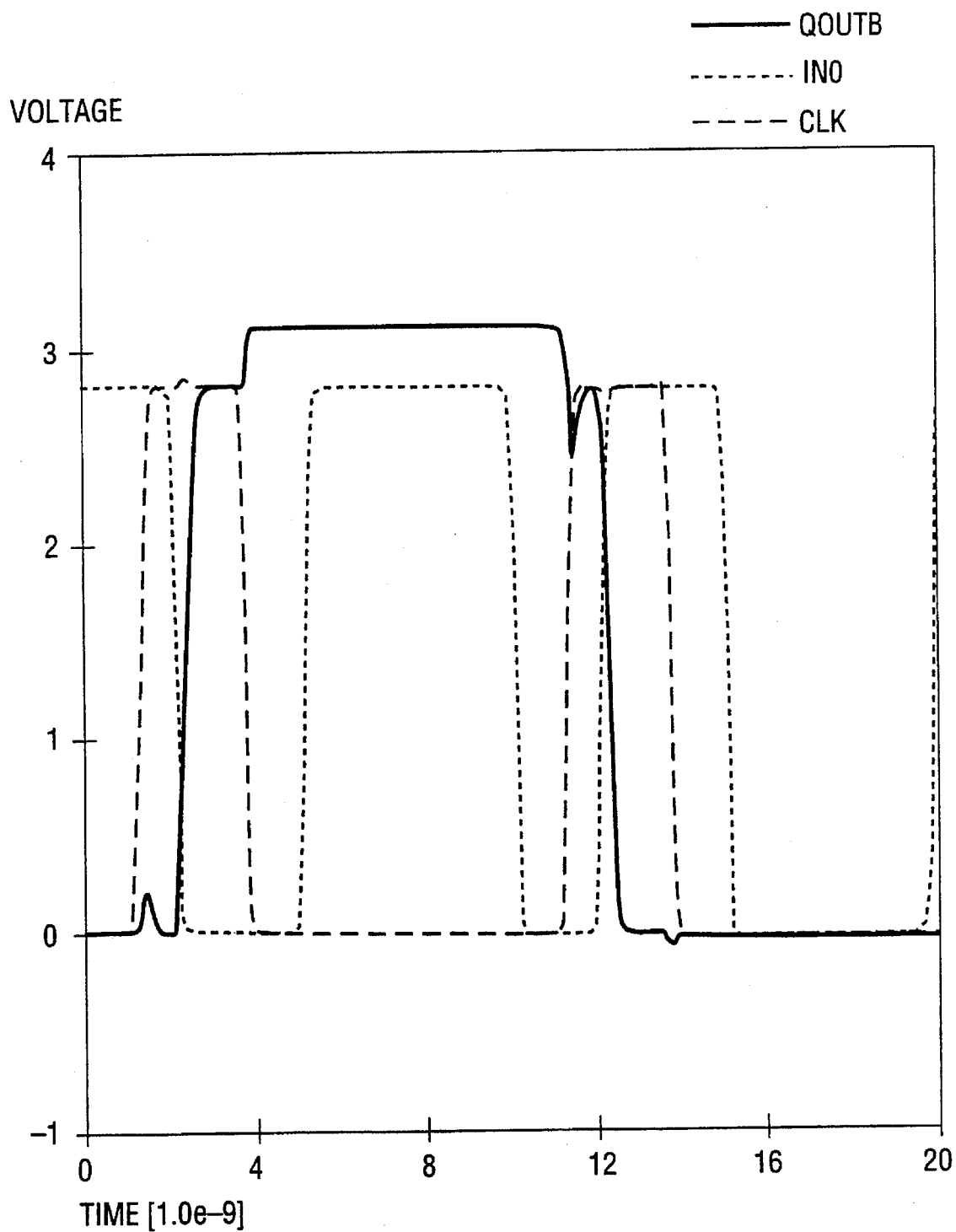
FIG. 11 is a signal timing diagram for the dynamic data latch of FIG. 9 when used with conventional clock signals, power supply voltages and MOSFET threshold voltages.
Figure 12:
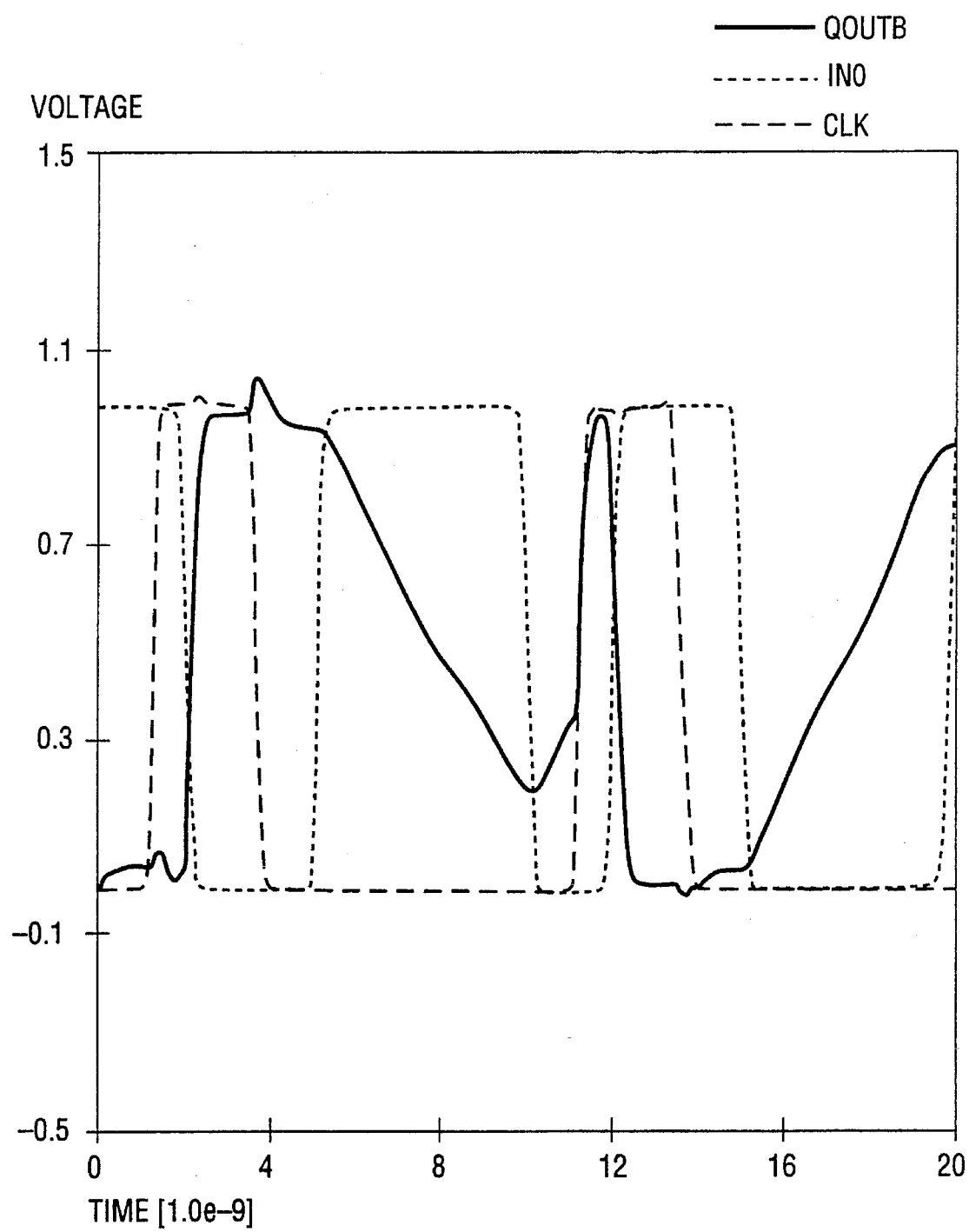
FIG. 12 is a signal timing diagram for the dynamic data latch of FIG. 9 when used with conventional clock signals, a reduced voltage power supply and reduced MOSFET threshold voltages.

Referring to FIGS. 10, 11 and 12, advantages realized by the dynamic data latch of FIG. 9 can be better appreciated. As shown in FIG. 10, when the buffered input data signal IN0 is synchronously clocked with the overdriven clock phases CLK, CLKB into the latch circuit via P-MOSFET TP1 and N-MOSFET TN1, the latched output QOUTB remains stable and maintains its peak signal levels.

Referring to FIGS. 11 and 12, however, when the secondary power supply potentials VDD1 and VSS1 are reduced and set equal to the conventional primary power supply potentials VDD0 and VSS0, things change. As shown in FIG. 11, when VDD0 and VSS0 are 2.8 and 0.0 volts, respectively, and the MOSFETs have conventional threshold voltages, the latched data output QOUTB is maintained. However, as shown in FIG. 12, when the primary power supply potentials VDD0, o VSS0 and secondary power supply potentials VDD1, VSS1 are maintained equal but reduced in magnitude to 1.0 and 0.0 volts, respectively, and the MOSFETs' threshold voltages are reduced, the latch fails. In other words, the latched output QOUTB is no longer maintained, i.e. due to leakage through the inverters, P-MOSFETs TP0, TP1 and N-MOSFETs TN1, TN0, the latch is unable to maintain the peak signal levels of the latched output QOUTB.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a data latch with reduced data signal leakage, said data latch comprising:

first and second power supply nodes for connecting to first and second power supply voltages, respectively;

a data source for providing a source data signal;

a data storage circuit including a data storage node for receiving a synchronous data signal and in accordance therewith providing at said data storage node a data signal having a data signal value within a range defined by upper and lower voltage values; and a data transfer circuit, coupled to said data source and said data storage circuit, for receiving said source data signal and first and second clock signals and in accordance therewith providing said synchronous data signal, wherein said coupled data storage and transfer circuits are coupled to said first and second power supply nodes and provide first and second current paths between said data storage node and said first and second power supply nodes, respectively, and wherein each one of said first and second clock signals has first and second clock signal states and has upper and lower peak clock signal levels defined by first and second voltage values which are above and below said upper and lower voltage values, respectively, whereby said data storage node is isolated from said first and second current paths during said first clock signal states of said first and second clock signals.

2. The apparatus of claim 1, wherein said data source comprises a logic signal source.

3. The apparatus of claim 1, wherein said data storage circuit comprises a static latch.

4. The apparatus of claim 1, wherein said data storage circuit comprises a dynamic latch.

5. The apparatus of claim 1, wherein said data transfer circuit comprises a plurality of pass gates.

6. The apparatus of claim 1, wherein said data transfer circuit comprises first and second subcircuits for receiving and becoming reverse-biased by said first and second clock signals during said first clock signal states thereof.

7. The apparatus of claim 6, wherein said first and second subcircuits comprise first and second pluralities of pass gates, respectively.

8. The apparatus of claim 1, further comprising an integrated circuit into which said data latch is integrated.

9. The apparatus of claim 1, further comprising a computer into which said data latch is incorporated.

10. A method of providing an apparatus including a data latch with reduced data signal leakage, said method comprising the steps of:

providing first and second power supply nodes for connecting to first and second power supply voltages, respectively;

providing a data source for providing a source data signal;

providing a data storage circuit including a data storage node for receiving a synchronous data signal and in accordance therewith providing at said data storage node a data signal having a data signal value within a range defined by upper and lower voltage values; and providing a data transfer circuit, coupled to said data source and said data storage circuit, for receiving said source data signal and first and second clock signals and in accordance therewith providing said synchronous data signal, wherein said coupled data storage and transfer circuits are coupled to said first and second power supply nodes and provide first and second current paths between said data storage node and said first and second power supply nodes, respectively, and wherein each one of said first and second clock signals has first and second clock signal states and has upper and lower peak clock signal levels defined by first and second voltage values which are above and below said upper and lower voltage values, respectively, whereby said data storage node is isolated from said first and second current paths during said first clock signal states of said first and second clock signals.

11. The method of claim 10, wherein said step of providing a data source comprises providing a logic signal source.

12. The method of claim 10, wherein said step of providing a data storage circuit comprises providing a static latch.

13. The method of claim 10, wherein said step of providing a data storage circuit comprises providing a dynamic latch.

14. The method of claim 10, wherein said step of providing a data transfer circuit comprises providing a plurality of pass gates.

15. The method of claim 10, wherein said step of providing a data transfer circuit comprises providing first and second subcircuits for receiving and becoming reverse-biased by said first and second clock signals during said first clock signal states thereof.

16. The method of claim 15, wherein said step of providing first and second subcircuits comprises providing first and second pluralities of pass gates, respectively.

17. The method of claim 10, further comprising the step of providing an integrated circuit into which said data latch is integrated.

18. The method of claim 10, further comprising the step of providing a computer into which said data latch is incorporated.

19. A method of latching data with reduced data signal leakage, said method comprising the steps of:

receiving first and second power supply voltages from first and second power supply nodes via first and second current paths, respectively;

receiving a source data signal from a data source;

receiving first and second clock signals;

providing a synchronous data signal with a data transfer circuit in accordance with said source data signal and said first and second clock signals; and receiving said synchronous data signal with a data storage circuit and in accordance therewith providing at a data storage node a latched data signal having a data signal value within a range defined by upper and lower voltage values;

wherein each one of said first and second clock signals has first and second clock signal states and has upper and lower peak clock signal levels defined by first and second voltage values which are above and below said upper and lower voltage values, respectively, whereby said data storage node is isolated from said first and second current paths during said first clock signal states of said first and second clock signals.

20. The method of claim 19, wherein said step of receiving a source data signal comprises receiving a logic signal.

21. The method of claim 19, wherein said step of receiving said synchronous data signal comprises statically latching said synchronous data signal.

22. The method of claim 19, wherein said step of receiving said synchronous data signal comprises dynamically latching said synchronous data signal.

23. The method of claim 19, wherein said step of providing a synchronous data signal comprises providing said synchronous data signal with a plurality of pass gates.

24. The method of claim 19, wherein said step of providing a synchronous data signal comprises providing said synchronous data signal with first and second subcircuits which receive and become reverse-biased by said first and second clock signals during said first clock signal states thereof.

25. The method of claim 24, wherein said step of providing said synchronous data signal with first and second subcircuits comprises providing said synchronous data signal with first and second pluralities of pass gates, respectively.

26. The method of claim 19, further comprising the step of performing the recited steps within an integrated circuit.

27. The method of claim 19, further comprising the step of performing the recited steps within a computer.

* * * * *